United States Patent
Rozman et al.

(10) Patent No.: US 9,166,465 B2
(45) Date of Patent: *Oct. 20, 2015

(54) CURRENT DIVIDER FOR EXTENDED CURRENT MEASUREMENT

(71) Applicant: Hamilton Sundstrand Corporation, Windsor Locks, CT (US)

(72) Inventors: Gregory I. Rozman, Rockford, IL (US); Steven J. Moss, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 240 days.

This patent is subject to a terminal disclaimer.

(21) Appl. No.: 13/898,748

(22) Filed: May 21, 2013

(65) Prior Publication Data

US 2014/0347024 A1    Nov. 27, 2014

(51) Int. Cl.
*H02H 3/00* (2006.01)
*H02M 1/00* (2007.01)
*G01R 19/00* (2006.01)
*H02H 3/08* (2006.01)

(52) U.S. Cl.
CPC ............ *H02M 1/00* (2013.01); *G01R 19/0092* (2013.01); *H02H 3/08* (2013.01)

(58) Field of Classification Search
CPC ....................................................... H02H 3/08
USPC ........................................................ 361/93.6
See application file for complete search history.

(56) References Cited

U.S. PATENT DOCUMENTS

| | | |
|---|---|---|
| 5,256,979 A | 10/1993 | Moorman |
| 6,677,850 B2 * | 1/2004 | Dames .......................... 338/307 |
| 7,564,147 B2 | 7/2009 | Michalko |
| 7,728,578 B2 * | 6/2010 | Etter et al. .................... 324/126 |
| 7,761,013 B2 * | 7/2010 | Futami .......................... 398/209 |
| 8,390,151 B2 | 3/2013 | Rozman et al. |
| 2006/0250153 A1 | 11/2006 | Colbeck |
| 2009/0287436 A1 | 11/2009 | Zang et al. |
| 2012/0007425 A1 | 1/2012 | Rozman et al. |
| 2013/0049465 A1 | 2/2013 | Rozman et al. |
| 2013/0050880 A1 | 2/2013 | Rozman et al. |
| 2013/0050890 A1 | 2/2013 | Rozman et al. |

OTHER PUBLICATIONS

European Search Report dated Oct. 1, 2014, for corresponding European Application No. 14160031.2.

* cited by examiner

*Primary Examiner* — Stephen W Jackson
(74) *Attorney, Agent, or Firm* — Kinney & Lange, P.A.

(57) ABSTRACT

A power controller controls power to a load and includes a primary conductor, a current divider, first and second current sensors, and a controller. The primary conductor carries a primary current to the load. The current divider is connected between the primary conductor and the load and includes a first conductor and a second conductor. The second conductor has a greater impedance than the first conductor. The first current sensor provides a first output representative of the primary current, and the second current sensor provides a second output representative of a secondary current in the second conductor of the current divider. The controller determines the primary current to the load based upon the first output when the primary current is less than a threshold value, and based upon the second output when the primary current is greater than the threshold value.

12 Claims, 2 Drawing Sheets

CURRENT DIVIDER FOR EXTENDED CURRENT MEASUREMENT

BACKGROUND

Solid state power controllers (SSPCs) are often used in power distribution systems to protect electrical systems from overload conditions. SSPCs often employ $I^2t$ over-current protection. $I^2t$ protection allows over-currents for a short amount of time based upon a threshold power flow. These over-currents may be, for example, 800% to 1000% of the steady-state current. Because of this, the SSPCs are required to have a high accuracy current sensor with a wide measuring range. For example, if a steady-state current is 200 amps, the current sensor must be able to accurately sense up to 2000 amps.

In the past, resistive shunts and Hall effect sensors have been used for current sensing in SSPCs. Resistive shunts, however, have power losses that can be quite high when required to support large over-currents. Hall effect sensors are non-contact sensors that sense current based upon a magnetic field created by current flowing in a conductor. These sensors include a core that is implemented around the conductor in which most of the magnetic field generated by the current is concentrated. The core includes an air gap, with a Hall effect device mounted in the air gap of the core at a right angle to the concentrated magnetic field. The Hall effect device produces a voltage that is proportional to the current in the conductor. The larger the current in the conductor, the larger the size of the Hall effect sensor that is required in order to provide accurate measurements. It is desirable to limit the size of these current sensors in order to reduce the size and weight of the SSPC.

SUMMARY

A power controller controls power to a load and includes a primary conductor, a current divider, first and second current sensors, and a controller. The primary conductor carries a primary current to the load. The current divider is connected between the primary conductor and the load and includes a first conductor and a second conductor. The second conductor has a greater impedance than the first conductor. The first current sensor provides a first output representative of the primary current, and the second current sensor provides a second output representative of a secondary current in the second conductor of the current divider. The controller determines the primary current to the load based upon the first output when the primary current is less than a threshold value, and based upon the second output when the primary current is greater than the threshold value.

DETAILED DESCRIPTION

A solid state power controller (SSPC) is disclosed herein that utilizes two current sensors to sense both steady-state currents and overcurrents to a load. The SSPC includes a primary conductor and a current divider. The primary conductor carries a primary current to the load. The current divider includes a first conductor that has a first impedance, and a second conductor that has a second impedance. The second impedance is greater than the first impedance. A primary current sensor senses the primary current in the primary conductor. A secondary current sensor senses current in the second conductor of the current divider. During steady-state conditions, a controller of the SSPC determines the total current to the load using an output of the primary current sensor. When the primary current reaches a threshold value, the controller uses the output from the secondary current sensor to determine the total current to the load. By using two smaller current sensors instead of one larger current sensor, the size and weight of the SSPC may be reduced.

Figure 1:
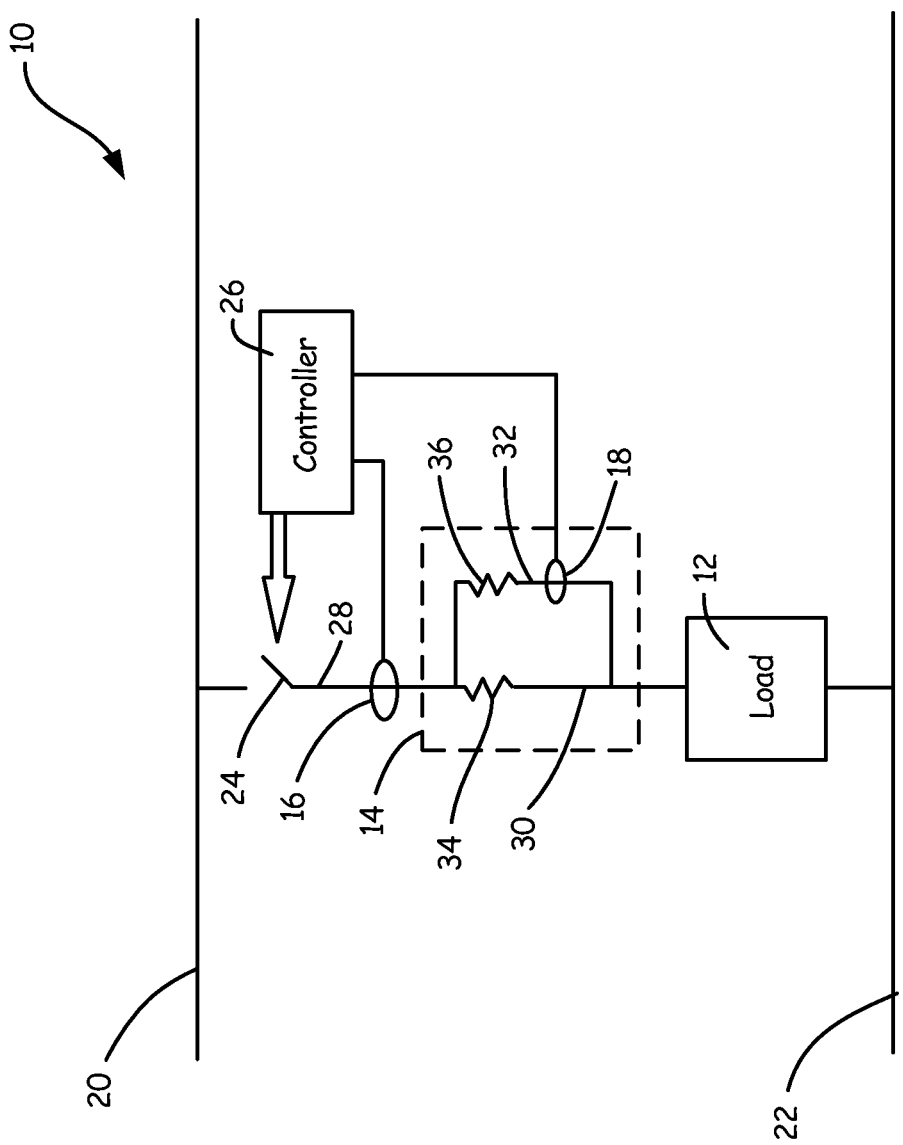
FIG. 1 is a circuit diagram illustrating a system for sensing current to a load using a current divider and two current sensors.

FIG. 1 is a circuit diagram illustrating system 10 for sensing current to load 12 using a current divider 14 and two current sensors 16 and 18. System 10 includes load 12, current divider 14, current sensors 16 and 18, positive rail 20, negative rail 22, power switch 24, controller 26, and primary conductor 28. Current divider 14 includes first conductor 30 and second conductor 32. System 10 may be, for example, a solid state power controller (SSPC) that controls power to load 12 by monitoring the total current to load 12. System 10 may employ, for example, $I^2t$ protection monitoring both steady-state currents as well as overcurrents of, for example, 200% to 1000% of the steady-state current. The steady-state current may be, for example, 200 amps.

Current sensors 16 and 18 sense current in system 10 to monitor for overload conditions. Current sensors 16 and 18 may be implemented as, for example, Hall effect sensors that provide an output voltage directly proportional to the respective current being sensed. Hall effect sensors are non-contact sensors that include a magnetic core, and a Hall effect device. A magnetic field generated by the current passing through the sensor is concentrated in the magnetic core. The Hall effect device produces an output voltage based upon the magnetic field concentrated in the magnetic core. If the current in the conductor is too great, the magnetic core can become saturated, causing the output voltage to no longer be directly proportional to the current flowing through the conductor.

Current sensor 16 senses current in primary conductor 28. The current in primary conductor 28 is equal to the total current provided to load 12. During steady-state conditions, controller 26 determines the current to load 12 based upon the output voltage of current sensor 16. Because the current in primary conductor 28 is equal to the total current to load 12, controller 26 determines the total current to load 12 based upon the output voltage of current sensor 16 and the gain of current sensor 16. During overcurrent conditions, the magnetic core of current sensor 16 may become saturated, preventing controller 26 from accurately determining the total current to load 12 based upon the output voltage of current sensor 16. Because of this, when the current in primary conductor 16 is greater than a threshold value such as, for example, 200% of the steady-state current, controller 26 no longer determines the total current to load 12 based upon the output of current sensor 16.

Current sensor 18 senses current in second conductor 32 of current divider 14. Current divider 14 is connected between primary conductor 28 and load 12. First conductor 30 has first impedance 34 and second conductor 32 has second impedance 36. Second impedance 36 is greater than first impedance 34, resulting in a lower magnitude of current flowing through second conductor 32. Because of this, the current in second conductor 32 during overcurrent conditions is smaller than the current in primary conductor 28. Current sensor 18 provides an output voltage directly proportional to the current in second conductor 32. Because the current is smaller, the core of current sensor 32 does not become saturated during overcurrent conditions. The necessary size of current sensor 18 is determined by impedances 34 and 36 of respective conductors 30 and 32. The smaller the current in second conductor 32 during overcurrent conditions, the smaller the size of current sensor 18 needed to accurately measure the current in second conductor 32 during overcurrent conditions.

When the total current to load 12 is greater than the threshold value, controller 26 determines the total current to load 12 based upon the output voltage of current sensor 18. The total current to load 12 can be determined based upon the impedances of first and second conductors 30 and 32 of current divider 14 along with the output voltage of current sensor 18. Controller 26 controls power switch 24 based upon the determined total current to the load. Power switch 24 is any known power switch such as, for example, a metal-oxide-semiconductor field-effect transistor (MOSFET). By using current sensors 16 and 18 in place of one current sensor capable of measuring current in both steady-state and overcurrent conditions, the size and weight of system 10 can be reduced.

Figure 2:
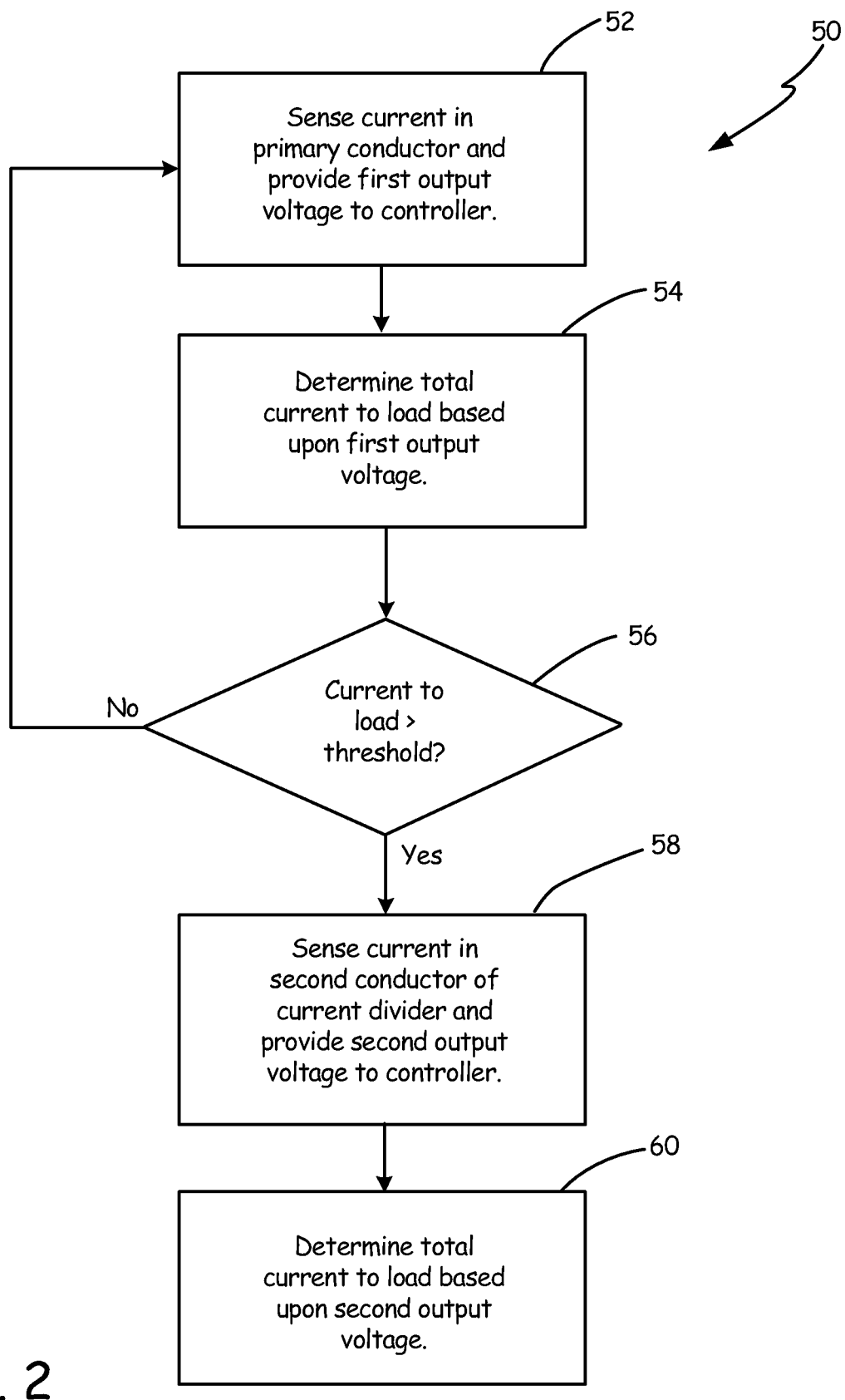
FIG. 2 is a flowchart illustrating a method of sensing a current using a current divider and two current sensors.

FIG. 2 is a flowchart illustrating method 50 of sensing a current using a current divider and two current sensors. At step 52, a first output voltage from current sensor 16 is provided to controller 26 that is directly proportional to the current in primary conductor 28. At step 54, controller 26 determines the total current to load 12 based upon the first output voltage and characteristics of sensor 16. At step 56, it is determined if the total current to load 12 is greater than a threshold value. If the total current to load 12 is greater than the threshold value, method 50 proceeds to step 58. If the total current to load 12 is not greater than the threshold value, method 50 returns to step 52. At step 58, a second output voltage from current sensor 18 is provided to controller 26 that is directly proportional to the current in second conductor 32 of current divider 14. At step 60, controller 28 determines the total current to load 12 based upon the second output voltage, the impedances of conductors 22 and 24, and the characteristics of current sensor 18.

The following are non-exclusive descriptions of possible embodiments of the present invention.

A power controller controls power to a load and includes, among other things, a primary conductor, a current divider, first and second current sensors, and a controller. The primary conductor carries a primary current to the load. The current divider is connected between the primary conductor and the load and includes a first conductor and a second conductor. The second conductor has a greater impedance than the first conductor. The first current sensor provides a first output representative of the primary current, and the second current sensor provides a second output representative of a secondary current in the second conductor of the current divider. The controller determines the primary current to the load based upon the first output when the primary current is less than a threshold value, and based upon the second output when the primary current is greater than the threshold value.

The power controller of the preceding paragraph can optionally include, additionally and/or alternatively, any one or more of the following features, configurations and/or additional components:

The first current sensor and the second current sensor are Hall effect sensors.

A power switch connected between the primary conductor and a power source, wherein the power switch is controlled by the controller to control power to the load.

The controller controls the power switch based upon the primary current to the load.

The threshold value is 200% of a steady-state value of the primary current.

A method includes, among other things: providing a first output to a controller using a first current sensor, determining a primary current based upon the first output using the controller, dividing the primary current between a first divider conductor and a second divider conductor, providing a second output to the controller using a second current sensor, and determining the primary current based upon the second output using the controller if the primary current is greater than a threshold value. The first output is directly proportional to the primary current to a load. The second divider conductor has a greater impedance than the first divider conductor, and the second output is directly proportional to a secondary current in the second divider conductor.

The method of the preceding paragraph can optionally include, additionally and/or alternatively, any one or more of the following features, configurations and/or additional components:

The first and second current sensors are Hall effect current sensors.

The method further includes controlling a power switch using the controller to control power to the load. The controller controls the power switch based upon the primary current.

The threshold value is 200% of a steady-state current value of the primary current.

A system includes, among other things: a power switch, a primary conductor, a primary current sensor, a current divider, a secondary current sensor, and a controller. The power switch is controlled to provide power to a load. The primary conductor carries a primary current from the power switch to the load. The primary current sensor provides a first output directly proportional to the primary current. The current divider includes a first conductor and a second conductor. The impedance of the second conductor is greater than the impedance of the first conductor. The secondary current sensor provides a second output directly proportional to a secondary current in the second conductor of the current divider. The controller controls the power switch based upon the primary current and determines the primary current based upon the first output if the primary current is less than a threshold value, and based upon the second output if the primary current is greater than the threshold value.

The system of the preceding paragraph can optionally include, additionally and/or alternatively, any one or more of the following features, configurations and/or additional components:

The primary current sensor and the secondary current sensor are Hall effect sensors.

The power switch, the primary conductor, the primary current sensor, the current divider, the secondary current sensor, and the controller are all including in a solid state power controller.

The threshold value is 200% of a steady-state value of the primary current.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A power controller that controls power to a load, the power controller comprising:
a primary conductor that carries a primary current to the load;
a power switch connected between the primary conductor and a power source;
a current divider connected between the primary conductor and the load, wherein the current divider includes a first conductor and a second conductor, the second conductor having a greater impedance than the first conductor;
a first current sensor that provides a first output representative of the primary current;
a second current sensor that provides a second output representative of a secondary current in the second conductor of the current divider; and
a controller that determines the primary current to the load based upon the first output when the primary current is less than a threshold value, and based upon the second output when the primary current is greater than the threshold value, wherein the power switch is controlled by the controller to control power to the load.

2. The power controller of claim 1, wherein the first current sensor and the second current sensor are Hall effect sensors.

3. The power controller of claim 1, wherein the controller controls the power switch based upon the primary current to the load.

4. The power controller of claim 1, wherein the threshold value is 200% of a steady-state value of the primary current.

5. A method comprising:
providing a first output to a controller using a first current sensor, wherein the first output is directly proportional to a primary current to a load;
determining the primary current based upon the first output using the controller;
dividing the primary current between a first divider conductor and a second divider conductor, wherein the second divider conductor has a greater impedance than the first divider conductor;
providing a second output to the controller using a second current sensor, wherein the second output is directly proportional to a secondary current in the second divider conductor; and
determining the primary current based upon the second output using the controller if the primary current is greater than a threshold value.

6. The method of claim 5, wherein the first and second current sensors are Hall effect current sensors.

7. The method of claim 5, further comprising controlling a power switch using the controller to control power to the load, wherein the controller controls the power switch based upon the primary current.

8. The method of claim 5, wherein the threshold value is 200% of a steady-state current value of the primary current.

9. A system comprising:
a power switch controlled to provide power to a load;
a primary conductor that carries a primary current from the power switch to the load;
a primary current sensor that provides a first output directly proportional to the primary current;
a current divider that includes a first conductor and a second conductor, wherein an impedance of the second conductor is greater than an impedance of the first conductor;
a secondary current sensor that provides a second output directly proportional to a secondary current in the second conductor of the current divider; and
a controller that controls the power switch based upon the primary current, wherein the controller determines the primary current based upon the first output if the primary current is less than a threshold value, and based upon the second output if the primary current is greater than the threshold value.

10. The system of claim 9, wherein the primary current sensor and the secondary current sensor are Hall effect sensors.

11. The system of claim 9, wherein the power switch, the primary conductor, the primary current sensor, the current divider, the secondary current sensor, and the controller are all including in a solid state power controller.

12. The system of claim 9, wherein the threshold value is 200% of a steady-state value of the primary current.

* * * * *